United States Patent [19]
Mine et al.

[11] Patent Number: 5,452,255
[45] Date of Patent: Sep. 19, 1995

[54] SEMICONDUCTOR MEMORY DEVICE

[75] Inventors: Naoyuki Mine, Yokohama; Tatsuo Ikawa, Kawasaki, both of Japan

[73] Assignee: Kabushiki Kaisha Toshiba, Kanagawa, Japan

[21] Appl. No.: 245,438

[22] Filed: May 18, 1994

[30] Foreign Application Priority Data

May 19, 1993 [JP] Japan .................. 5-117300

[51] Int. Cl.6 .................. G11C 7/00; G11C 8/00
[52] U.S. Cl. .................. 365/221; 365/236; 365/239; 365/240
[58] Field of Search ............ 365/230.05, 230.09, 365/239, 221, 236, 240, 221, 236, 239, 240

[56] References Cited

U.S. PATENT DOCUMENTS

| | | | |
|---|---|---|---|
| 5,042,014 | 8/1991 | Pinkham et al. | 365/230.05 |
| 5,117,388 | 5/1992 | Nakano et al. | 365/221 X |
| 5,260,905 | 11/1993 | Mori | 365/230.05 |
| 5,239,509 | 8/1993 | Ikawa et al. | 365/230.05 X |
| 5,311,468 | 5/1994 | Anderson | 365/221 X |

*Primary Examiner*—David C. Nelms
*Assistant Examiner*—Son Dinh
*Attorney, Agent, or Firm*—Spensley Horn Jubas & Lubitz

[57] ABSTRACT

There is provided a semiconductor memory device having output ports for serially accessing memory cells connected to a plurality of select lines, comprising: a decode counter adapted to be supplied with an initial value to count up to generate a plurality of counter address signals to output first decode signals obtained by decoding the counter address signals; and a serial decoder adapted to be supplied with the first decode signals respectively outputted from the decode counter to decode them to output second decode signals for selectig any one of the select lines.

41 Claims, 9 Drawing Sheets

SEMICONDUCTOR MEMORY DEVICE

BACKGROUND OF THE INVENTION

This invention relates to a semiconductor memory device, and more particularly to a semiconductor memory device of the dual port configuration having serially accessable output ports and random-accessable output ports.

In recent years, in various fields, there has been increased high speed requirement for semiconductor devices, and there has been increased demand for serially accessable devices. For such serially accessable memory device, there is, e.g., an image memory device. The image memory device generally includes a random-access memory section (RAM section) for carrying out random access and a serial-access memory section (SAM section) for carrying out serial-access. The RAM section has a configuration similar to that of ordinary DRAM or SRAM, etc., and carries out access substantially in a similar manner. The SAM section includes one register in respective columns and serially accesses data of these registers. The RAM section and the SAM section can respectively provide accesses in an asynchronous manner. Further, data can be transferred between the RAM section and the SAM section.

Figure 7:
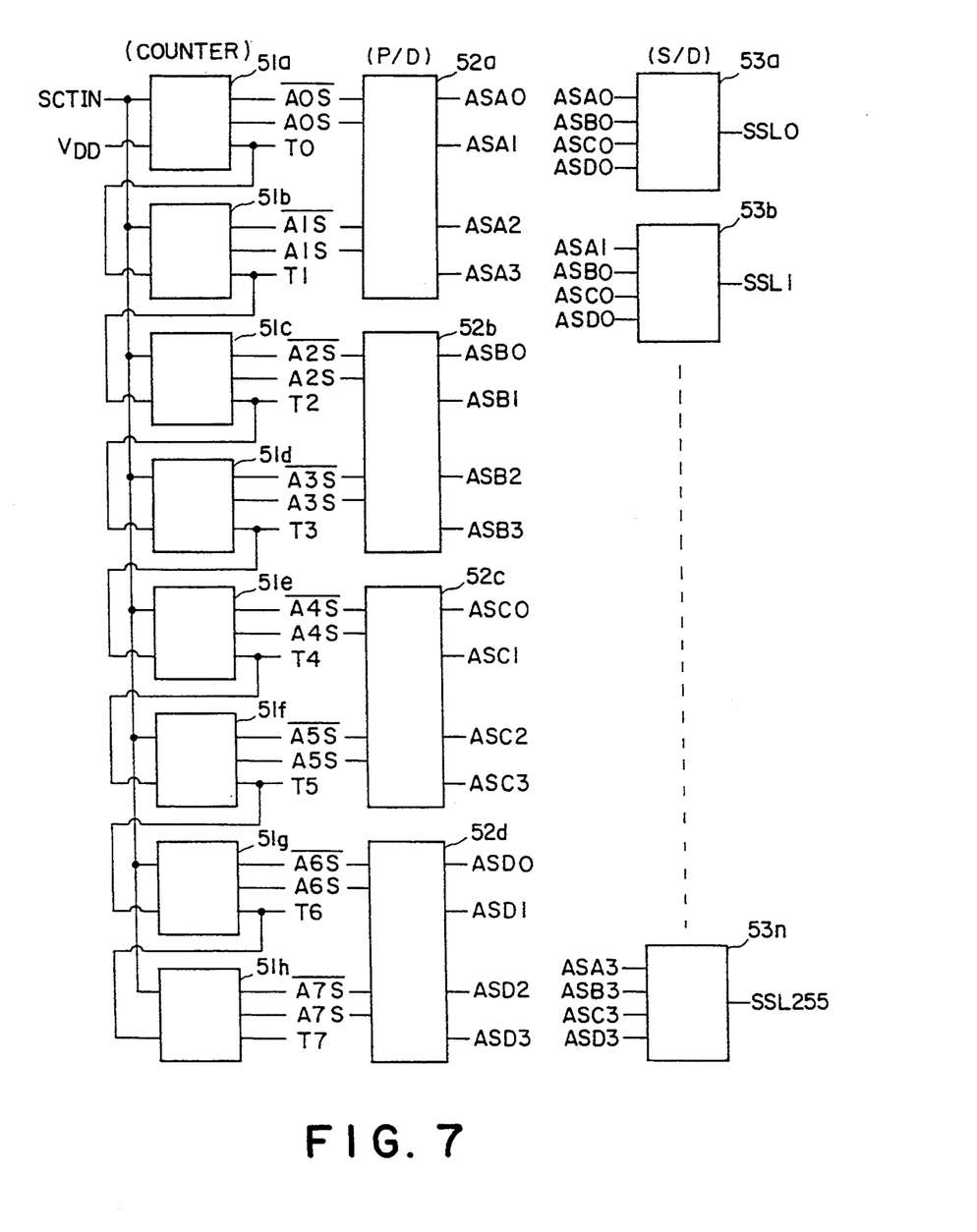
FIG. 7 is a circuit diagram showing the configuration of a semiconductor memory device related to this invention.

The configuration and the operation for carrying out, in the SAM section, count up operation to generate counter address signals to decode them will now be described. The circuit configuration of a device related to this invention is shown in FIG. 7. This circuit includes counters 51a~51h, partial decoders 52a~52d, and serial decoders 53a~53n.

In this device, memory cells (not shown) are arranged in a form of matrix of 256 rows by 256 columns. In the case of carrying out serial access, it is necessary to select any one of 256 select lines SSL connected to respective registers. For this reason, an address signal of 8 bits is used.

A power supply voltage VDD is delivered to counters 51a~51h. Further, since the internal state of the circuit is unstable at the time of initially turning the power supply ON, signal SCTIN is inputted as an initial value. In these counters 51a~51h, counted up counter address signals A0S~A7S, /A0S~/A7S are generated and outputted therefrom. These counter address signals A0S~A7S, /A0S~/A7S are first partially decoded by partial decoders 52a~52d and are further decoded by serial decoders 53a~53n.

First, two sets of counter address signals are inputted to partial decoders 52a~52d, and are partially decoded. For example, counter address signals A0S and A1S, /A0S and /A1S outputted from counters 51a and 51b are inputted to partial decoder 52a. Thus, counter address decode signals ASA0~ASA3 are generated and outputted. Similarly, counter address signals A2S and A3S, /A2S and /A3S, A4S and A5S,/A4S and/A5S, A6S and A7S, and/A6S and /A7S are respectively inputted to other partial decoders 52b~52d. Thus, count address decode signals ASB0~ASB3, ASC0~ASC3, ASD0~ASD3 are outputted.

The counter address decode signals ASA0~ASA3, ASB0~ASB3, ASC0~ASC3 and ASD0~ASD3 thus outputted are inputted to 256 serial decoders 53a~53n in the state where they are combined four by four, at which they are decoded. For example, counter address decode signals ASA0, ASB0, ASC0, ASD0 are inputted to serial decoder 53a. Thus, a signal of high level or low level is outputted to one select line SSL0. By these serial decoders 53a~53n, any one of select lines SSL0~SSL255 is caused to be at high level.

Figure 3:
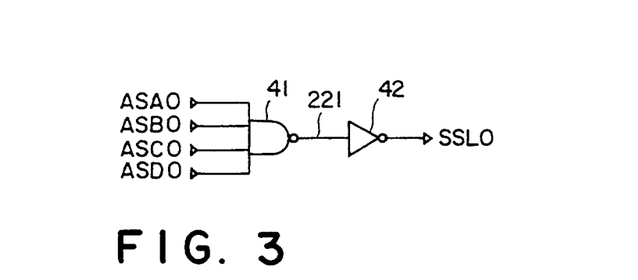
FIG. 3 is a circuit diagram showing the configuration of serial decoder in the semiconductor memory device shown in FIG. 1.
Figure 8A:
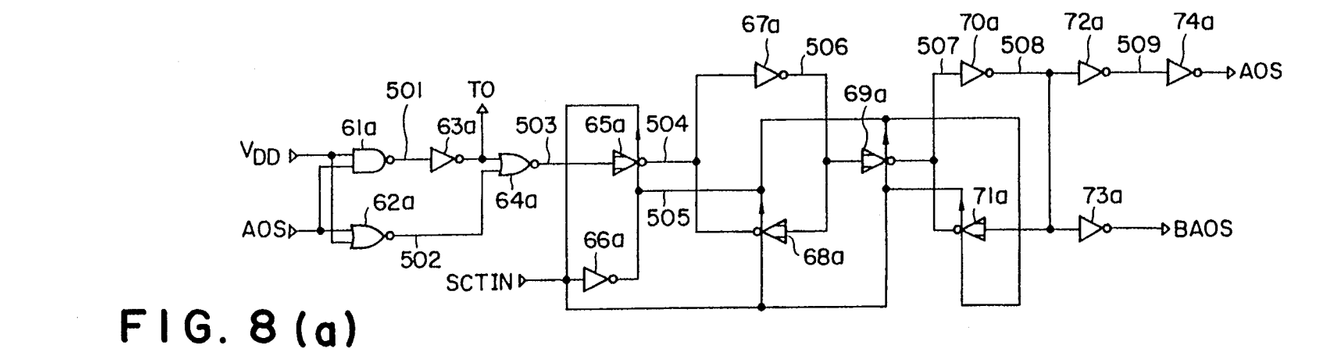
FIGS. 8(a) and 8(b) are circuit diagrams showing the configuration of counter in the semiconductor memory device shown in FIG. 7.
Figure 8B:
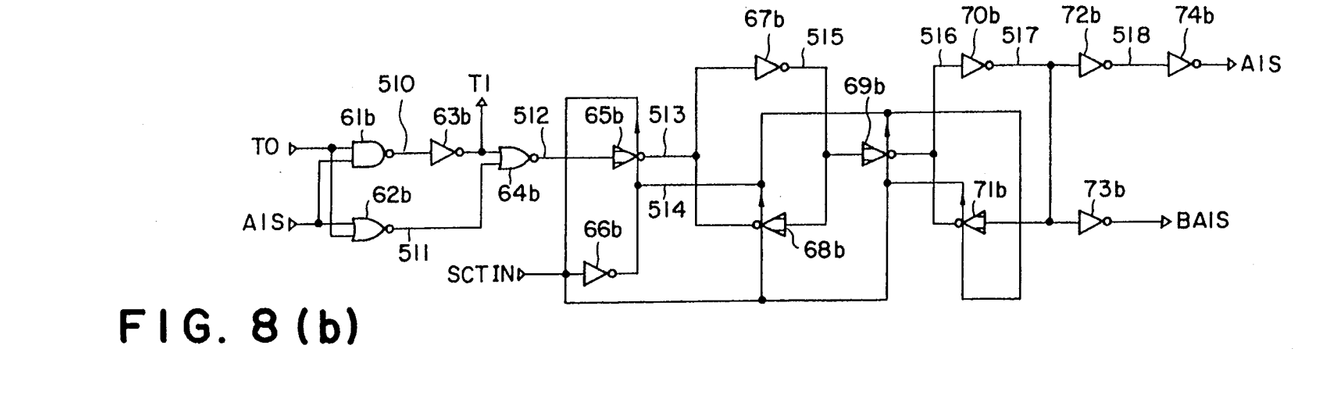
Figure 9:
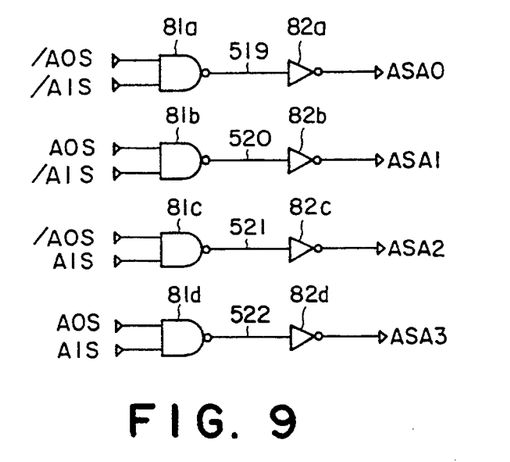
FIG. 9 is a circuit diagram showing the configuration of partial decoder in the semiconductor memory device shown in FIG. 7.

The configurations of counters 51a and 51b are respectively shown in FIGS. 8(a) and (b), the configuration of partial decoder 52a is shown in FIG. 9, and the configuration of serial decoder 53a is shown in FIG. 3.

Figure 10:
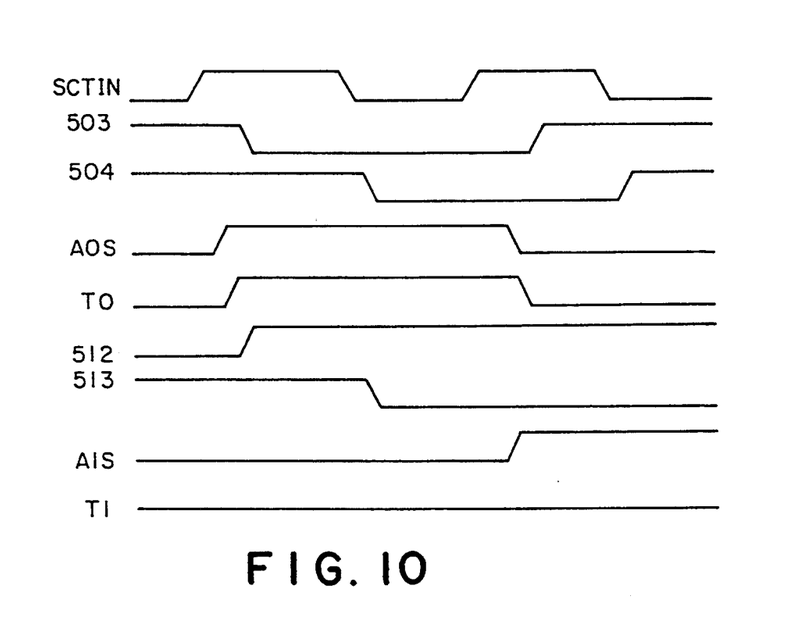
FIG. 10 is a time chart showing waveforms of input/output signals of counter in the semiconductor memory device shown in FIG. 7.

The counter 51a shown in FIG. 8(a) includes a NAND circuit 61a, inverters 63a, 66a, 67a, 70a and 72a~74a, NOR circuits 62a and 64a, and clocked inverters 65a, 68a, 69a and 71a, and the waveforms of input signal SCTIN, output signals A0S and T0, and respective nodes 503 and 504 are as shown in FIG. 10. As described above, power supply voltage VDD and signal SCTIN for giving initial value are inputted to counter 51a. Thus, counted up counter address signals A0S, /A0S are outputted. Counter address signal A0S of these signals is outputted from inverter 74a and is inputted to NOR circuit 62a. Moreover, signal T0 outputted from counter 51a is a CARRY signal for carrying address. This signal T0 is inputted to NAND circuit 61b (see FIG. 8(a)). A signal outputted from node 503 corresponds to an address count up signal indicating an address which has been counted up by CARRY signal T0 and counter address signal A0S. From nodes 504 and 507, first and second latch signals for holding this address count up signal are respectively outputted.

First, when signal SCTIN falls down to low level as shown in FIG. 10, an address count up signal indicating an address counted up by CARRY signal T0 and counter address signal A0S is outputted from node 503. This signal is converted into a first latch signal on node 504 through clocked inverter 65a, i.e., appears as first latch signal on node 504. When signal SCTIN rises up to high level for a second time, first latch signal is converted into a second latch signal on node 507 through inverter 67a, clocked inverter 69a, i.e., appears as a second latch signal on node 507. As a result, levels of counter address signals A0S, /A0S are switched.

Partial decoder 52a includes, as shown in FIG. 9, NAND circuit 81a~81d and inverters 82a~82d, and are adapted to be supplied with counter address signals A0S, A1S,/A0S, /A1S outputted from counters 51a and 51b. Thus, any one of counter address decode signals ASA0~ASA3 is selected and is caused to be at high level. The counter address decode signal of high level thus selected is outputted from partial decoder 52a. Similarly, counter address signals A2S, A3S,-/A2S,/A3S, A4S, A5S,/A4S,/A5S, A6S, A7S,/A6S, /A7S respectively outputted from counters 51c and 51d, 51e and 51f, 51g and 51h are also inputted to other partial decoders 52b~52d. Further, any ones of counter address decode signals ASB0~ASB3, ASC0~ASC3, ASD0~ASD3 are caused to be at high level and are outputted from partial decoders 52b~52d, respectively.

Serial decoder 53a includes, as shown in FIG. 3, a NAND circuit 41 and an inverter 42, and is adapted to be supplied with counter address decode signals ASA0-~ASD0 to output a signal of high level to select line SSL0 only when these signals are all at high level. Thus, a signal of high level is outputted from one decoder which has been supplied with signals that are all at high level of all serial decoders 53b~53n.

However, this device had the following problem. As described above, counters 51a~51h for carrying out count up and partial decoders 52a~52d for carrying out partial decode at the first stage were constructed as different circuits. Many wirings were required between the counters 51a~51h and partial decoders 52a~52d, resulting in increased chip area. Further, access speed was delayed by resistance and capacitance parasitic to the wiring.

In addition, this device also had the problem that current consumption is increased. Counter address signals A0S~A7S outputted from counters 51a~51h and counter address decode signals ASA0~ASA3, ASB3, ASC3, ASD3 outputted from partial decoders 52a~52d have waveforms as shown in FIG. 11.

Figure 11:
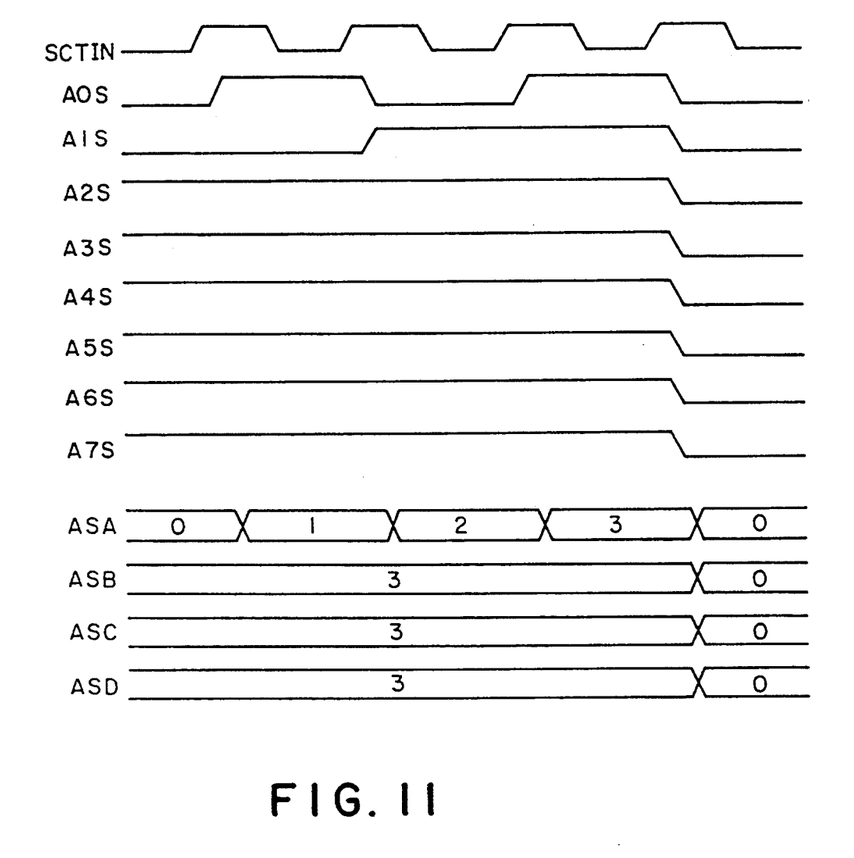
FIG. 11 is a time chart showing the manner of how signals A1S~A7S and ASA~ASD vary in accordance with pulses of signal SCTIN in the semiconductor memory device shown in FIG. 7.

As described above, signal SCTIN for providing an initial value as shown in FIG. 11 is inputted to decoders 51a~51h. First, the level of counter address signal A0S is switched by the first pulse, the levels of counter address signals A0S and A1S are switched by the second pulse, the level of counter address signal A0S is switched by the third pulse, and the levels of counter address signals A0S~A7S are switched by the fourth pulse.

Further, the levels of counter address signals ASA0 and ASA1 are switched by the first pulse of signal SCTIN, the levels of counter address signals ASA1 and ASA2 are switched by the second pulse, the levels of counter address signals ASA2 and ASA3 are switched by the third pulse, and the levels of counter address signals ASA3, ASA0, ASB3, ASB0, ASC3, ASC0, ASD3, ASD0 are switched by the fourth pulse.

Figure 12:
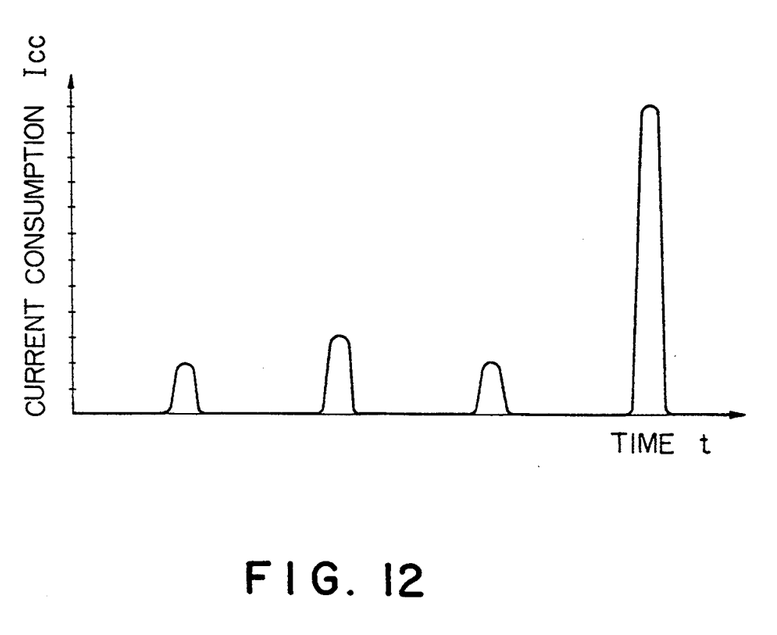
FIG. 12 is an explanatory view showing a change in point of time of a current consumption in the semiconductor memory device shown in FIG. 7.

The levels of respective signals are switched in this way, whereby charge/discharge operations take place on respective output terminals. As a result, currents are consumed. A change of current consumption versus passage of times is shown in FIG. 12. In this figure, time on the abscissa corresponds to timing at which the level of signal SCTIN in FIG. 11 is switched.

As apparent from FIG. 12, current consumption Icc increases every time signal SCTIN is switched. Further, this current consumption Icc increases to much degree according as the number of signals switched is increased.

When current consumption Icc increases, ground voltage Vss changes. By this noise based on such voltage change, any erroneous operation takes place. Particularly, in the memory device having RAM section and SAM section, there was the possibility that when they are operative in a manner asynchronous with each other, noise which has taken place in the SAM section is transmitted up to the RAM section through the same ground voltage terminal, so any erroneous operation may take place in the RAM section.

SUMMARY OF THE INVENTION

Accordingly, an object of this invention is to provide a semiconductor memory device which can attain reduction of the chip area, improvement in the access speed, reduction of current consumption, and prevention of occurrence of erroneous operation.

In accordance with this invention, there is provided a semiconductor memory device having output ports for serially accessing memory cells connected to a plurality of select lines, comprising a decoder counter adapted to be supplied with an initial value to count up to generate a plurality of counter address signals to output first decode signals obtained by decoding the counter address signals, and a serial decoder adapted to be respectively supplied with the first decode signals outputted from the decode counter to decode them to output second decode signals for selecting any one of the select lines.

Since the decode counter commonly has the function to be supplied with an initial value to count up to generate a plurality of counter address signals and the function to output first decode signals obtained by decoding these counter address signals, wiring required in the case where those functions are respectively realized with separate circuits becomes unnecessary, so the chip area is reduced. Further, since there is, in this invention, no resistance or capacitance parasitic in the case where wiring exists, the access speed is improved. In addition, since this device carries out the count up operation and the operation for decoding counter address signal by using the same circuit, the number of count up operations is decreased as compared to the case whose those operations are realized by separate circuits, and the current consumption is reduced. Thus, occurrence of an erroneous operation by change in power supply can be prevented.

DESCRIPTION OF THE PREFERRED EMBODIMENTS

A preferred embodiment of this invention will now be described with reference to the attached drawings.

Figure 1:
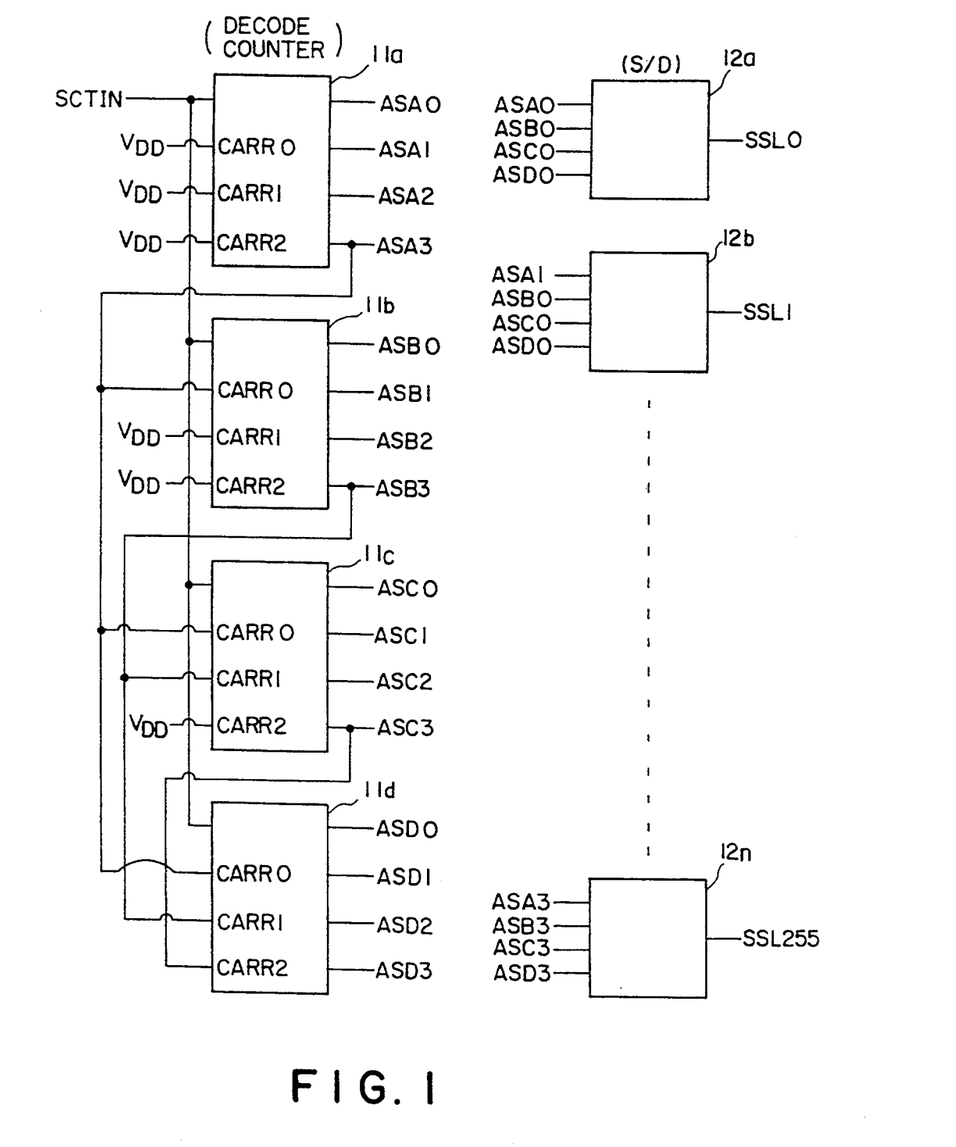
FIG. 1 is a circuit diagram showing the configuration of a semiconductor memory device according to an embodiment of this invention.

The configuration of the portion for counting up to generate count address signals to decode them in the semiconductor memory device of this embodiment is shown in FIG. 1. This device includes decode counters 11a~11d commonly having the count-up function of counters 51a~51h and the partial decode function of partial decoders 52a~52d, and serial decoders 12a~12n for carrying out the final decode.

The device of this embodiment has 256 ($=2^n$, n=8 in this example) select lines SSL for the purpose of serially accessing memory cells of 256 rows by 256 columns. Since decode counters 11a~11d carry out count up in a quaternary manner, there are provided four ($=n/2$) decode counters.

As described later, these decode counters 11a~11d carry out count up to partially decode signals thus generated as decoding at the first stage to output counter address decode signals ASA0~ASA3, ASB0~ASB3, ASC0~ASC3, ASD0~ASD3 of 16 ($=2n$) bits.

As shown in FIG. 1, power supply voltage VDD is delivered to the first decode counter 11a as signals CARRY0~2, and power supply voltage VDD is delivered to decode counter 11b as signals CARRY1 and 2, and counter address decode signal ASA3 is inputted thereto as signal CARRY0. To decode counter 11c, power supply voltage VDD is inputted as CARRY2, counter address decode signal ASA3 is inputted as signal CARRY0, and counter address decode signal ASB3 is inputted as signal CARRY1. To decode counter 11d, counter address decode signal ASA3 is inputted as signal CARRY0, counter address decode signal ASB3 is inputted as signal CARRY1, and counter address decode signal ASC3 is inputted as signal CARRY2.

Further, counter address decode signals ASA0~ASA3, ASB0~ASB3, ASC0~ASC3, ASD0~ASD3 respectively outputted from decode counters 11a~11d are inputted to serial decoders 12a~12n, at which they are decoded. These serial decoders 12a~12n have a configuration as shown in FIG. 3 similarly to the serial decoders 53a~53n shown in FIG. 7.

Figure 2:
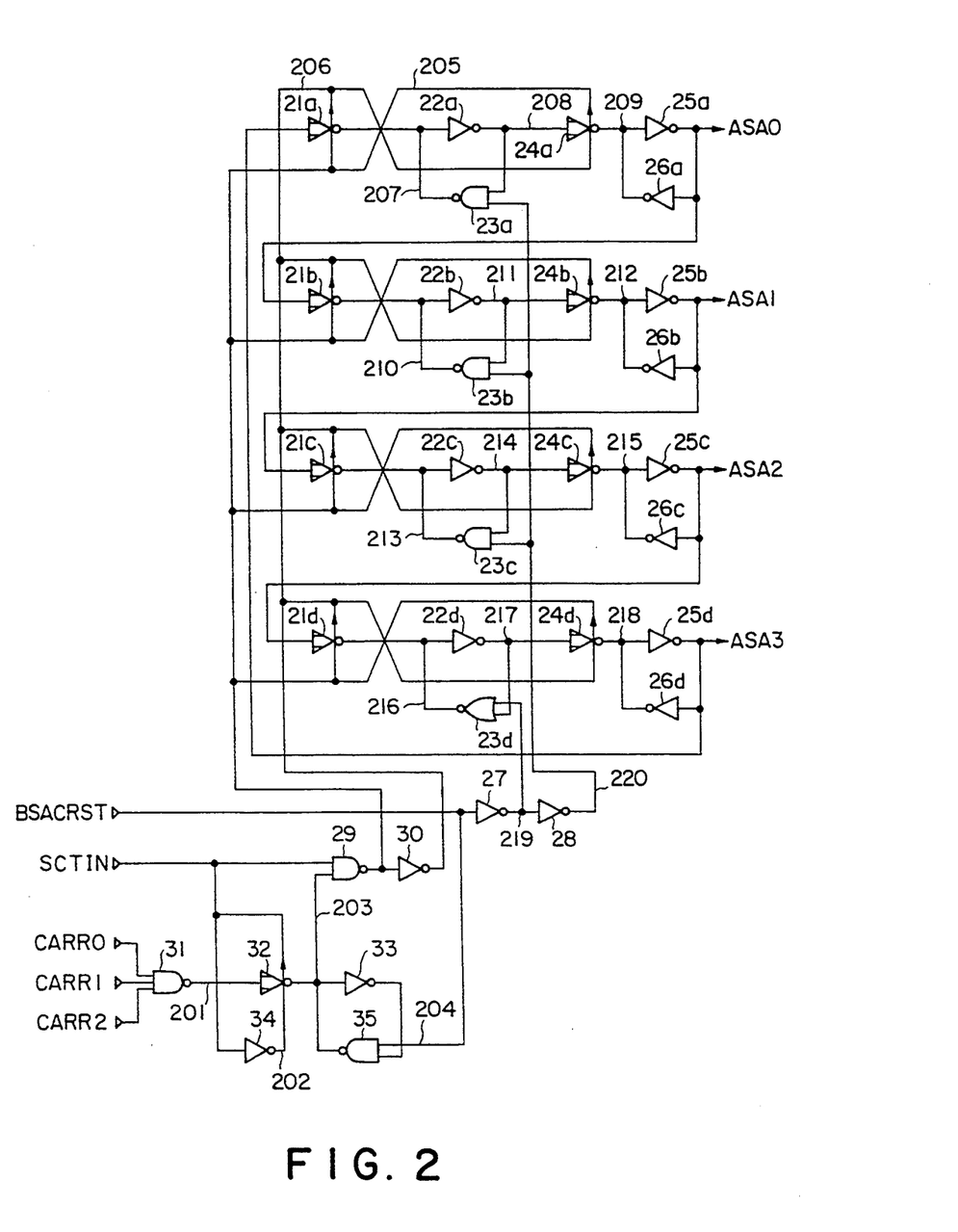
FIG. 2 is a circuit diagram showing the configuration of decode counter in the semiconductor memory device shown in FIG. 1.

The detailed configuration of decode counter 11a is shown in FIG. 2.

The decode counter 11a includes an input section to be supplied with CARRY0~CARRY2 for carrying address, a signal SCTIN for triggering count-up operation and decode operation, and a signal BSACRST for providing an initial value at the time of initially turning power supply ON. This input section comprises NAND circuits 29, 31 and 35, inverters 27, 28, 30, 33 and 34, and a clocked inverter 32. Further, the decode counter 11a includes four blocks respectively connected to an output node 219 of inverter 27, an output node 220 of inverter 28, an output node 205 of NAND circuit 29, and an output node 206 of inverter 30, and adapted to generate counter address decode signals ASA0~ASA3. When block for generating counter address decode signal ASA0 is taken as an example, this block includes clocked inverters 21a and 24a, inverters 22a, 25a and 26a, and a NAND circuit 23a.

In this embodiment, inverters 27 and 28 supplied with signal BSACRST constitutes an initial value setting section for outputting an initial value setting signal.

Further, NAND circuits 29, 31 and 35, inverters 30, 33 and 34, and clocked inverter 32 which are supplied with signal BSACRST, signal SCTIN, and signals CARR0~CARR2 constitute a control section adapted to output a control signal for controlling the count-up operation and the decode operation.

The block including clocked inverters 21a and 24a, inverters 22a, 25a and 26a and NAND circuit 23a constitutes a count-up and decode section adapted to be supplied with initial value setting signal and control signal to carry out the count-up operation and the decode operation to output counter address decode signal ASA0. Similarly, the block including clocked inverters 21b and 24b, inverters 22b, 25b and 26b, and NAND circuit 23b constitutes a count-up and decode section adapted to be supplied with initial value setting signal and control signal to output counter address decode signal ASA1. The block including clocked inverters 21c and 24c, inverters 22c, 25c and 26c, and NAND circuit 23c constitutes a count-up and decode section adapted to be supplied with initial value setting signal and control signal to output counter address decode signal ASA2. In addition, the block including clocked inverters 21d and 24d, inverters 22d, 25d and 26d, and NAND circuit 23d constitutes a count-up and decode section adapted to be supplied with initial value setting signal and control signal to output counter address decode signal ASA3.

Figure 4:
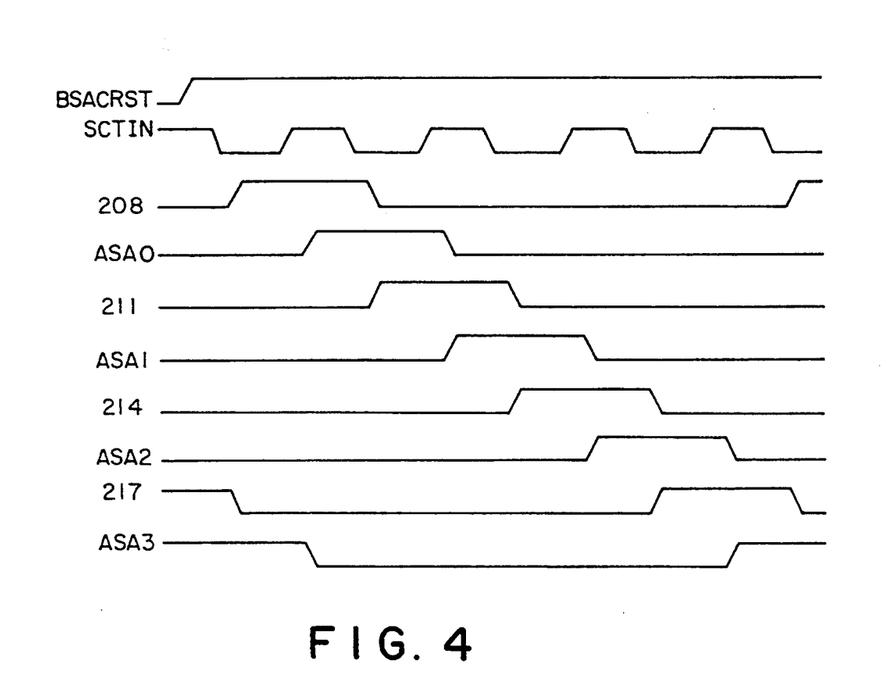
FIG. 4 is a time chart showing waveforms of input/output signals of decode counter in the semiconductor memory device shown in FIG. 1.

Waveforms of input/output signals of the decode counter 11a and respective nodes 201~220 are shown in FIG. 4. In this example, signal BSACRST serves to provide an initial value for discharging charges on respective nodes in order that the operation is not unstable at the time of initially turning power supply ON as described above. Potentials on nodes 208, 211, 214, 217 connected to output terminals of inverters 22a~22d correspond to first latch signals for holding decode address count up signals which have been counted up by inputted signals CARRY0~2. In addition, counter address decode signals ASA0~ASA3 outputted from output terminals of inverters 25a~25d correspond to second latch signals for holding decode address count up signals.

It is first assumed that signal BSACRST rises up to high level at the time of initially turning power supply ON and signal SCTIN is at high level. First latch signals outputted to nodes 208, 211, 214 and 217 are caused to be at low level, low level, low level and high level, respectively. Further, by signal SCTIN, counter address decode signals ASA0~ASA3 are caused to be at low level, low level, low level and high level, respectively. The counter address decode signal ASA3 is at high level at the initial stage. When signal SCTIN falls down to low level, potential on node 208 is caused to be at high level, so potential of high level appears as first latch signal. When signal SCTIN rises up to high level for a second time, the first latch signal outputted to the node 208 appears on the output terminal of inverter 25a as counter address decode signal ASA0.

In a manner stated above, signals appear in sequence, e.g., in order of counter address signal ASA3, first latch signal, counter address decode signal ASA0 every pulse of signal SCTIN, and counter address decode signals ASA0~ASA3 are sequentially switched to high level.

Counter address decode signals ASA0~ASA3, ASB0~ASB3, ASC0~ASC3, ASD0~ASD3 generated at respective decode counters 11a~11d and outputted therefrom in this way are inputted to serial decoders 12a~12n in the state where they are combined four by four. A signal of high level is outputted through select line SSL from a serial decoder of which all input signals are at high level.

As stated above, in this embodiment, the function that the counter has and the function that the partial decoder has are realized by respective one decode counters 11a~11d. For this reason, in the device shown in FIG. 7 mentioned above, the region where wiring between counters 51a~51h and partial decoders 52a~52d are carried out was required. On the contrary, this emboidment does not require such region. Thus, the chip area is reduced. Moreover, since resistance and capacitance parasitic to wiring do not exist, the access time is reduced.

Figure 5:
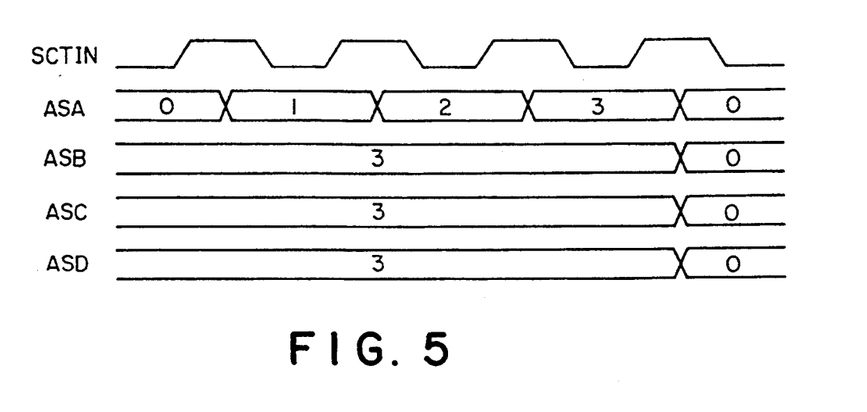
FIG. 5 is a time chart showing changes of signals SCTIN and ASA0~ASC3 in the semiconductor memory device shown in FIG. 1.

Further, in accordance with this emboidment, the current consumption is also reduced. Changes of waveforms of signal SCTIN and counter address decode signals ASA0~ASA3, ASB0~ASB3, ASC0~ASC3, ASD0~ASD3 in the decode counters 11a~11d are shown in FIG. 5. The levels of counter address decode signals ASA0 and ASA1 are switched by the first pulse of signal SCTIN, and the levels of signals ASA1 and ASA2 are switched by the second pulse thereof. Further, the levels of counter address decode signals ASA2 and ASA3 are switched by the third pulse of the signal SCTIN, and the levels of signals ASA3 and ASA0, ASB3 and ASB0, ASC3 and ASC0, ASD3 and ASD0 are switched by the fourth pulse.

Figure 6:
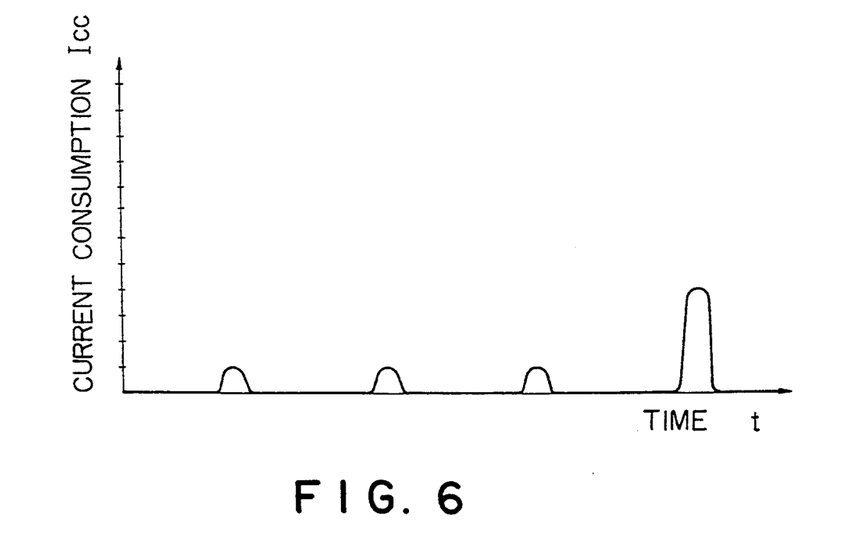
FIG. 6 is an explanatory view showing change in point of time of current consumption in the semiconductor memory device shown in FIG. 1.

How the value of a current consumption varies in correspondence with pulses of signal SCTIN is shown in FIG. 6. According as the number of counter address decode signals varying in correspondence with pulses of the signal SCTIN is greater, the current consumption Icc increases to more degree. In the device shown in FIG. 7, the number of signals switched in accordance with pulses of signal SCTIN is great as described above with reference to FIG. 11. On the contrary, the number of signals switched in this embodiment is small. For this reason, as compared to the device shown in FIG. 7, current consumption is decreased to more degree in this embodiment. As a result, change of ground voltage Vss followed by increase in the current consumption is suppressed. Thus, occurrence of an erroneous operation is prevented. Further, in the device shown in FIG. 7, noise by change of power supply which takes place in the SAM section is transmitted to the RAM section via the same ground terminal, thus bringing about an erroneous operation. However, such an unfavorable situation can be also avoided in this embodiment.

It should be noted that the above-described embodiment is presented only for illustrative purpose, but does not limit this invention by any means. While, e.g., selection of 256 select lines is carried out in this embodiment, it is needless to say that the number of select lines is not limited to such number.

In the case where, e.g., the number of select lines is 16 ($=2^n$, n=4), it is sufficient to output first decode signals of 8 ($=2n$) bits by a decode counter comprised of two ($=n/2$) blocks to output second decode signals of 16 bits by a serial decoder comprised of 16 blocks.

For example, in the case where the number of select lines is 65536 (n=16), it is sufficient to output first decode signals of 32 bits by a decode counter comprised of 8 blocks to output second decode signals of 65536 bits by a serial decoder comprised of 65536 blocks.

In addition, when, in addition to the circuit of the embodiment shown in FIGS. 1 to 3, there is employed a circuit configuration adapted to carry out, by using a decode counter, the operation for partially decoding signals generated by count-up to output first decode signals to decode the first decode signals by a serial decoder to select any one of select lines, any other configurations may be also adopted.

What is claimed is:

1. A semiconductor memory device having output ports for serially accessing memory cells connected to a plurality of select lines, comprising:
    a decode counter including a first stage unit having a plurality of output terminals, the first stage unit receiving a trigger signal and outputting first decode signals to select one of the output terminals sequentially, the decode counter also including at least one (i+1)-th (i is an integer of 1 or more) stage unit having a plurality of output terminals for receiving the trigger signal and one of the first decode signals of a preceeding i-th stage unit and for outputting first decode signals of 2n bits (n is an integer of 2 or more) to select one of the output terminals of the (i+1)-th stage unit sequentially; and
    a serial decoder adapted to be supplied with the first decode signals respectively output from the decode counter, to decode the first decode signals and to output second decode signals for selecting any one of the select lines.

2. A semiconductor memory device in which memory cells are connected to $2^n$ (n is an integer of 2 or more) select lines every m (m is an integer of 2 or more) memory cells, the semiconductor memory device having output ports for serially accessing said m memory cells connected to any one of the select lines, comprising:
    a decode counter including a first stage unit having 2n output terminals for receiving a trigger signal and outputting first decode signals of 2n bits to select one of the output terminals sequentially, and at least one (n/2)-th stage unit having 2n output terminals for receiving the trigger signal and one of the first decode signals of a (n/2−1)-th stage unit and outputting first decode signals of 2n bits to select one of the output terminals of the (n/2)-th stage unit sequentially, wherein the operation of the (n/2)-th stage unit is controlled by the one of the first decode signals of the (n/2−1)-th stage unit so that the (n/2)-th stage unit is not activated until the (n/2)-th stage unit receives the one of the first decode signals of the (n/2−1)-th stage unit; and
    a serial decoder adapted to be supplied with the first decode signals respectively output from the decode counter, to carry out a decoding operation in a second stage operation and to output second decode signals of $2^n$ bits for selecting any one of the select lines.

3. A semiconductor memory device in which memory cells are connected to $2^n$ (n is an integer of 2 or more) select lines every m (m is an integer of 2 or more) memory cells, the semiconductor memory device having output ports for serially accessing m memory cells connected to any one of the select lines, comprising:
    a decode counter including a first stage unit having 2n output terminals for receiving a trigger signal and outputting first decode signals of 2n bits to select one of the output terminals sequentially, and at least one (n/2)-th stage unit other than the first stage unit, the at least one (n/2)-th stage unit having 2n output terminals receiving the trigger signal and one of the first decode signals of a (n/2−1)-th stage unit and outputting first decode signals of 2n bits to select one of the output terminals of the (n/2)-th stage unit sequentially; and
    a serial decoder adapted to be supplied with the first decode signals respectively outputted from the decode counter to carry out a decoding operation in a second stage of a decoding operation to output second decode signals of $2^n$ bits for selecting any one of the select lines, wherein the first stage unit comprises:
a reset section for receiving an initial signal and outputting a reset signal;
a control section for receiving the trigger signal and outputting a first signal; and
a count-up and decode section including a plurality of first shift registers connected in series to form a ring connection, wherein the count-up and decode section receives the reset signal output from the reset section which causes the count-up and decode section to be set in a predetermined status, and wherein the count-up and decode section receives the trigger signal and the first signal output from the control section and outputs first decode signals in response to the first signal;

each of the at least one (n/2)-th stage units other than the first stage unit comprising:
a second reset section for receiving the initial signal and outputting a second reset signal,
a second control section for receiving the trigger signal and one of the first decode signals output from the first stage unit and outputting a second signal, and
a second count-up and decode section including a plurality of second shift registers connected in series to form a ring connection, wherein the second count-up and decode section receives the second reset signal output from the second reset section which sets the second count-up and decode section in the predetermined status, and wherein the second shift registers are not activated until the second shift registers receive the second signal output from the second control section.

4. The semiconductor memory device of claim 2 wherein a time at which the operation of the (n/2)-th stage unit starts is delayed as compared with a time at which operation of the (n/2−1)-th stage unit starts.

5. The semiconductor memory device of claim 3 wherein a time at which operation of the (n/2)-th shift register starts is delayed as compared with a time at which the operation of the (n/2−1)-th shift registers starts.

6. A selection circuit for serially selecting a plurality of selection lines, comprising:
a first unit for receiving a trigger signal, the first unit having a first means for receiving the trigger signal and for generating a first signal, and a plurality of first shift registers connected in series to form a ring connection, wherein each of the first shift registers is controlled by the first signal and outputs a first output signal;
a second unit for receiving the trigger signal, the second unit having a second means for receiving the trigger signal and one of the first output signals output from the first shift registers and for generating a second signal, the second unit also having a plurality of second shift registers connected in series to form a ring connection, wherein each of the second shift registers is controlled by the second signal and outputs a second output signal; and
a plurality of decoding means for decoding the first output signals output from the first unit and the second output signals output from the second unit, and for selecting one of the selection lines.

7. A selection circuit for serially selecting a plurality of selection lines, comprising:
a first unit for receiving a trigger signal, the first unit having a first means for receiving the trigger signal and for generating a first signal, and a plurality of first shift registers connected in series to form a ring connection, wherein each of the first shift registers is controlled by the first signal and outputs a first output signal;
a second unit for receiving the trigger signal, the second unit having a second means for receiving the trigger signal and one of the first output signals output from the first shift registers and for generating a second signal, and a plurality of second shift registers connected in series to form a ring connection, wherein each of the second shift registers is controlled by the second signal and outputs a second output signal;
a third unit for receiving the trigger signal, the third unit having a third means for receiving the trigger signal, one of the first output signals output from the first shift registers and one of the second output signals output from the second shift registers and for generating a third signal, the third unit also having a plurality of third shift registers connected in series to form a ring connection, wherein each of the third shift registers is controlled by the third signal and outputs a third output signal; and
a plurality of decoding means for decoding the first output signals output from the first unit, the second output signals output from the second unit, and the third output signals output from the third unit, and for selecting one of the selection lines.

8. A selection circuit for serially selecting a plurality of selection lines, comprising:
a first unit for receiving a trigger signal, the first unit having a first means for receiving the trigger signal and for generating a first signal, the first unit also having a plurality of first shift registers connected in series to form a ring connection, wherein each of the first shift registers is controlled by the first signal and outputs a first output signal;
a second unit for receiving the trigger signal, the second unit having a second means for receiving the trigger signal and one of the first output signals output from the first shift registers and for generating a second signal, the second unit also having a plurality of second shift registers connected in series to form a ring connection, wherein each of the second shift registers is controlled by the second signal and outputs a second output signal;
a third unit for receiving the trigger signal, the third unit having a third means for receiving the trigger signal, one of the first output signals output from the first shift registers and one of the second output signals output from the second shift registers and for generating a third signal, the third unit also having a plurality of third shift registers connected in series to form a ring connection, wherein each of the third shift registers is controlled by the third signal and outputs a third output signal;
a fourth unit for receiving the trigger signal, the fourth unit having a fourth means for receiving the trigger signal, one of the first output signals output from the first shift registers one of the second output signal output from the second shift registers, and one of the third output signals output from the third shift registers and for generating a fourth signal, the fourth unit also having a plurality of fourth shift registers connected in series to form a ring connection, wherein each of the fourth shift registers is controlled by the fourth signal and outputs a fourth output signal; and a plurality of decoding means for decoding the first output signals output from the first unit, the second output signals output from the second unit, the third output signals output from the third unit, and the fourth output signals output from the fourth unit, and for selecting one of the selection lines.

9. The selection circuit of claim 6, wherein the first unit has a first reset unit for receiving an initial signal and for outputting a first reset signal to one of the first shift registers to set the one of the first shift registers in a first predetermined state, wherein a second reset signal is input into the other first shift registers to set the other first shift registers in a second predetermined state, and wherein the second unit has a second reset unit for receiving the initial signal and for outputting the first reset signal to one of the second shift registers to set the one of the second shift registers in the first predetermined state, wherein a second reset signal is input to the other second shift registers to set the other second shift registers in the second predetermined state.

10. The selection circuit of claim 7, wherein the first unit has a first reset unit for receiving an initial signal and for outputting a first reset signal to a one of the first shift registers to set the one of the first shift registers in a first predetermined state, wherein a second reset signal is input to the other first shift registers to set the other first shift registers in a second predetermined state, wherein the second unit has a second reset unit for receiving the initial signal and for outputting the first reset signal being to a one of the second shift registers to set the one of the second shift registers in the first predetermined state, wherein a second reset signal is input to the other second shift registers to set the other second shift registers in the second predetermined state, and the third unit has a third reset unit for receiving the initial signal and for outputting the first reset signal to a one of the third shift registers to set the one of the third shift registers in the first predetermined state, wherein the second reset signal is input to the other third shift registers to set the other third shift registers in the second predetermined state.

11. The selection circuit of claim 8, wherein the first unit has a first reset unit for receiving an initial signal and for outputting a first reset signal to a one of the first shift registers to set the one of the first shift registers in a first predetermined state, wherein a second reset signal being is input to the other first shift registers to set the other first shift registers in a second predetermined sate, wherein the second unit has a second reset unit for receiving the initial signal and for outputting the first reset signal to a one of the second shift registers to set the one of the second shift registers in the first predetermined state, wherein a second reset signal is input to the other second shift registers to set the other second shift registers in the second predetermined state, wherein the third unit has a third reset unit for receiving the initial signal and for outputting the first reset signal to a one of the third shift registers to set the one of the third shift registers in the first predetermined state, wherein the second reset signal is input to the other third shift registers to set the other third shift registers in the second predetermined state, and wherein the fourth unit has a fourth reset unit for receiving the initial signal and for outputting the first reset signal to a one of the fourth shift registers to set the one of the third shift registers in the first predetermined state, wherein the second reset signal is input to the other fourth shift registers to set the other fourth shift registers in the second predetermined state.

12. The selection circuit of claim 6, wherein each of the first shift registers includes a first clocked inverter having an input terminal and an output terminal, a first flip-flop circuit having an input terminal connected to the output terminal of the first clocked inverter and an output terminal, a second clocked inverter having an input terminal connected to the output terminal of the first flip-flop circuit and an output terminal, and a second flip-flop circuit having an input terminal connected to the output terminal of the second clocked inverter and an output terminal, wherein the output terminal of the second flip-flop circuit included in each of the first shift registers is connected to the input terminal of the first clocked inverter included in one of the other first shift registers to form a ring connection, and wherein each of the second shift registers includes a third clocked inverter having an input terminal and an output terminal, a third flip-flop circuit having an input terminal connected to the output terminal of the fourth clocked inverter and an output terminal, a fourth clocked inverter having an input terminal connected to the output terminal of the third flip-flop circuit and an output terminal, and a fourth flip-flop circuit having an input terminal connected to the output terminal of the fourth clocked inverter and an output terminal, wherein the output terminal of the fourth flip-flop circuit included in each of the second registers is connected to the input terminal of the third clocked inverter included in one of the other second shift registers to form a ring connection.

13. The selection circuit of claim 7, wherein each of the first shift registers includes a first clocked inverter having an input terminal and an output terminal, a first flip-flop circuit having an input terminal connected to the output terminal of the first clocked inverter and an output terminal, a second clocked inverter having an input terminal connected to the output terminal of the first flip-flop circuit and an output terminal, and a second flip-flop circuit having an input terminal connected to the output terminal of the second clocked inverter and an output terminal, wherein the output terminal of the second flip-flop circuit included in each of the first shift registers is connected to the input terminal of the first clocked inverter included in one of the other first shift registers to form a ring connection, wherein each of the second shift registers includes a third clocked inverter having an input terminal and an output terminal, a third flip-flop circuit having an input terminal connected to the output terminal of the fourth clocked inverter and an output terminal, a fourth clocked inverter having an input terminal connected to the output terminal of the third flip-flop circuit, and a fourth flip-flop circuit having an input terminal connected to the output terminal of the third clocked inverter and an output terminal, wherein the output terminal of the fourth flip-flop circuit included in each of the second registers is connected to the input terminal of the third clocked inverter included in one of other second shift registers to form a ring connection, and wherein each of the third shift registers includes a fifth clocked inverter having an input terminal and an output terminal, a fifth flip-flop circuit having an input terminal connected to the output terminal of the fifth clocked inverter and an output terminal, a sixth clocked inverter having an input terminal connected to the output terminal of the fifth flip-flop circuit, and a sixth flip-flop circuit having an input terminal connected to the output terminal of the sixth clocked inverter and an output terminal, wherein the output terminal of the sixth flip-flop circuit included in each of the third registers is connected to the input terminal of the fifth clocked inverter included in one of the other third shift registers to form a ring connection.

14. The selection circuit of claim 8, wherein each of the first shift registers includes a first clocked inverter having an input terminal and an output terminal, a first flip-flop circuit having an input terminal connected to the output terminal of the first clocked inverter and an output terminal, a second clocked inverter having an input terminal connected to the output of the first flip-flop circuit and an output terminal, and a second flip-flop circuit having an input terminal connected to the output terminal of the second clocked inverter and an output terminal, wherein the output terminal of the second flip-flop circuit included in each of the first shift registers is connected to the input terminal of the first clocked inverter included in one of the other first shift registers to form a ring connection, wherein each of the second shift registers includes a third clocked inverter having an input terminal and an output terminal, a third flip-flop circuit having an input terminal connected to the output terminal of the fourth clocked inverter and an output terminal, a fourth clocked inverter having an input terminal connected to the output terminal of the third flip-flop circuit, and a fourth flip flop circuit having an input terminal connected to the output terminal of the third clocked inverter and an output terminal, wherein the output terminal of the fourth flip-flop circuit included in each of the second registers is connected to the input terminal of the third clocked inverter included in one of the other second shift registers to form a ring connection, wherein each of the third shift registers includes a fifth clocked inverter having an input terminal and an output terminal, a fifth flip-flop circuit having an input terminal connected to the output terminal of the fifth clocked inverter and an output terminal, a sixth clocked inverter having an input terminal connected to the output terminal of the fifth flip-flop circuit, and a sixth flip-flop circuit having an input terminal connected to the output terminal of the sixth clocked inverter and an output terminal, wherein the output terminal of the sixth flip-flop circuit included in each of the third registers is connected to the input terminal of the fitch clocked inverter included in another of the third shift registers to form a ring connection, and wherein each of the fourth shift registers includes a seventh clocked inverter having an input terminal and an output terminal, a seventh flip-flop circuit having an input terminal connected to the output terminal of the seventh clocked inverter and an output terminal, an eighth clocked inverter having an input terminal connected to the output terminal of the seventh flip-flop circuit, and an eighth flip-flop circuit having an input terminal connected to the output terminal of the eighth clocked inverter and an output terminal, wherein the output terminal of the eighth flip-flop circuit included in each of the fourth registers is connected to the input terminal of the seventh clocked inverter included in one of the other fourth shift registers to form a ring connection.

15. The selection circuit of claim 12, wherein the first unit includes a first reset unit for receiving an initial signal and for outputting complementary first reset signals, and the second unit includes a second reset unit for receiving an initial signal and for outputting complementary second reset signals each of the first flip-flop circuits of the first shift registers includes a first inverter having an input terminal connected to the output terminal of the first clocked inverter and an output terminal connected to the input terminal of the second docked inverter, and a first two-input logical gate having one input terminal connected to the output of the first inverter and the other input terminal coupled to the first reset unit to receive another of the first reset signals, and the output terminal of the first logical gate connected to the input terminal of the first inverter, and each of the second flip-flop circuits of the second shift registers includes a second inverter having an input terminal connected to the output terminal of the third docked inverter and an output terminal connected to the input terminal of the fourth docked inverter, and a second two-input logical gate having one input terminal connected to the output of the second inverter and the other input terminal coupled to the second reset unit to receive another of the second reset signals, and the output terminal of the second logical gate connected to the input terminal of the second inverter.

16. The selection circuit of claim 13, wherein the first unit includes a first reset unit for receiving an initial signal and for outputting complementary first reset signals, the second unit includes a second reset unit for receiving the initial signal and for outputting complementary second reset signals, and the third unit includes a third reset unit for receiving the initial signal and for outputting complementary third reset signals, each of the first flip-flop circuits of the first shift registers includes a first inverter having an input terminal connected to the output terminal of the first docked inverter and an output terminal connected to the input terminal of the second clocked inverter, and a first two-input logical gate having one input terminal connected to the output of the first inverter and the other input terminal coupled to the first reset unit to receive another of the first reset signals, and the output terminal of the first logical gate connected to the input terminal of the first inverter, each of the second flip-flop circuits of the second shift registers includes a second inverter having an input terminal connected to the output terminal of the third clocked inverter and an output terminal connected to the input terminal of the fourth clocked inverter, and a second two-input logical gate having one input terminal connected to the output of the second inverter and the other input terminal coupled to the second reset unit to receive another of the second reset signals, and the output terminal of the second logical gate connected to the input terminal of the second inverter; and each of the third flip-flop circuits of the third shift registers includes a third inverter having an input terminal connected to the output terminal of the fifth clocked inverter and an output terminal connected to the input terminal of the sixth clocked inverter, and a third two-input logical gate having one input terminal connected to the output of the third inverter and the other input terminal coupled to the third reset unit to receive another of the third reset signals, and the output terminal of the third logical gate connected to the input terminal of the third inverter.

17. The selection circuit of claim 14, wherein the first unit includes a first reset unit for receiving an initial signal and for outputting complementary first reset signals, the second unit includes a second reset unit for receiving the initial signal and for outputting complementary second reset signals, the third unit includes a third reset unit for receiving the initial signal and for outputting complementary third reset signals, and the fourth unit includes a fourth reset unit for receiving the initial signal and for outputting complementary fourth reset signals;

each of the first flip-flop circuits of the first shift registers includes a first inverter having an input terminal connected to the output terminal of the first clocked inverter and an output terminal connected to the input terminal of the second clocked inverter, and a first two-input logical gate having one input terminal connected to the output of the first inverter and the other input terminal coupled to the first reset unit to receive another of the first reset signals, and the output terminal of the first logical gate connected to the input terminal of the first inverter;

each of the second flip-flop circuits of the second shift registers includes a second inverter having an input terminal connected to the output terminal of the third clocked inverter and an output terminal connected to the input terminal of the fourth clocked inverter, and a second two-input logical gate having one input terminal connected to the output of the second inverter and the other input terminal coupled to the second reset unit to receive another of the second reset signals, and the output terminal of the second logical gate connected to the input terminal of the second inverter;

each of the third flip-flop circuits of the third shift registers includes a third inverter having an input terminal connected to the output terminal of the fifth clocked inverter and an output terminal connected to the input terminal of the sixth clocked inverter, and a third two-input logical gate having one input terminal connected to the output of the third inverter and the other input terminal coupled to the third reset unit to receive another of the third reset signals, and the output terminal of the third logical gate connected to the input terminal of the third inverter; and each of the fourth flip-flop circuits of the fourth shift registers includes a fourth inverter having an input terminal connected to the output terminal of the seventh clocked inverter and an output terminal connected to the input terminal of the eighth clocked inverter, and a fourth two-input logical gate having one input terminal connected to the output of the fourth inverter and the other input terminal coupled to the fourth reset unit to receive another of the fourth reset signals, and the output terminal of the fourth logical gate connected to the input terminal of the fourth inverter.

18. The selection circuit of claim 6, wherein the first means includes a first logical gate having an input terminal for receiving a predetermined potential and an output terminal, a flip-flop circuit for receiving an initial signal and a potential of the output terminal of the first logical gate and holding the predetermined potential, and a gating means for receiving the trigger signal and the predetermined potential and outputting the first signal to control an operation of the first shift registers, and the second means includes a second logical gate having an input terminal for receiving the one of the first output signals output from the first shift registers and an output terminal, a flip-flop circuit for receiving an initial signal and a potential of the output terminal of the second logical gate and holding the predetermined potential, and a gating means for receiving the trigger signal and the predetermined potential and outputting the second signal to prevent the trigger signal from being input into the second shift registers until the one of the first output signals is input into the input terminal of the second logical gate.

19. The selection circuit of claim 7, wherein the first means includes a first logical gate having an input terminal for receiving a predetermined potential and an output terminal, a flip-flop circuit for receiving an initial signal and a potential of the output terminal of the first logical gate and holding the predetermined potential, and a gating means for receiving the trigger signal and the predetermined potential and outputting the first signal to control an operation of the first shift registers, the second means includes a second logical gate having an input terminal for receiving the one of the first output signals output from the first shift registers and an output terminal, a flip-flop circuit for receiving an initial signal and a potential of the output terminal of the second logical gate and holding the predetermined potential, and a gating means for receiving the trigger signal and the predetermined potential and outputting the second signal to prevent the trigger signal from being input into the second shift registers until the one of the first output signals is input into the input terminal of the second logical gate, and the third means includes a third logical gate having one input terminal for receiving the one of the first output signals output from the first shift registers and the other input terminal for receiving one of the second output signals output from the second shift registers and an output terminal, a flip-flop circuit for receiving an initial signal and a potential of the output terminal of the third logical gate and holding the predetermined potential, and a gating means for receiving the trigger signal and the predetermined potential and outputting the third signal to prevent the trigger signal from being input into the third shift registers until both the one of the first output signals and the one of the second output signals are input into the input terminal of the third logical gate.

20. The selection circuit of claim 8, wherein the first means includes a first logical gate having an input terminal for receiving a predetermined potential and an output terminal, a flip-flop circuit for receiving an initial signal and a potential of the output terminal of the first logical gate and holding the predetermined potential, and a gating means for receiving the trigger signal and the predetermined potential and outputting the first signal to control an operation of the first shift registers, the second means includes a second logical gate having an input terminal for receiving the one of the first output signals output from the first shift registers and an output terminal, a flip-flop circuit for receiving an initial signal and a potential of the output terminal of the second logical gate and holding the predetermined potential, and a gating means for receiving the trigger signal and the predetermined potential and outputting the second signal to prevent the trigger signal from being input into the second shift registers until the one of the first output signals is input into the input terminal of the second logical gate, the third means includes a third logical gate having one input terminal for receiving the one of the first output signals output from the first shift registers and the other input terminal for receiving one of the second output signals output from the second shift registers and an output terminal, a flip-flop circuit for receiving an initial signal and a potential of the output terminal of the third logical gate and holding the predetermined potential, and a gating means for receiving the trigger signal and the predetermined potential and outputting the third signal to prevent the trigger signal from being input into the third shift registers until both the one of the first output signals and the one of the second output signals are input into the input terminal of the third logical gate, and the fourth means includes a fourth logical gate having a first input terminal for receiving the one of the first output signals output from the first shift registers, a second input terminal for receiving one of the second output signals output from the second shift registers, and a third input terminal for receiving one of the third output signals output from the third shift registers and an output terminal, a flip-flop circuit for receiving an initial signal and a potential of the output terminal of the fourth logical gate and holding the predetermined potential, and a gating means for receiving the trigger signal and the predetermined potential and outputting the fourth signal to prevent the trigger signal from being input into the fourth shift registers until all the one of the first output signals, the one of the second output signals, and the one of the third output signals are input into the input terminals of the fourth logical gate.

21. The selection circuit of claim 9, wherein the first means includes a first logical gate having an input terminal for receiving a predetermined potential and an output terminal, a flip-flop circuit for receiving the initial signal and a potential of the output terminal of the first logical gate and holding the predetermined potential, and a gating means for receiving the trigger signal and the predetermined potential and outputting the first signal to control an operation of the first shift registers, and the second means includes a second logical gate having an input terminal for receiving the one of the first output signals output from the first shift registers and an output terminal, a flip-flop circuit for receiving the initial signal and a potential of the output terminal of the second logical gate and holding the predetermined potential, and a gating means for receiving the trigger signal and the predetermined potential and outputting the second signal to prevent the trigger signal from being input into the second shift registers until the one of the first output signals is input into the input terminal of the second logical gate.

22. The selection circuit of claim 10, wherein the first means includes a first logical gate having an input terminal for receiving a predetermined potential and an output terminal, a flip-flop circuit for receiving the initial signal and a potential of the output terminal of the first logical gate and holding the predetermined potential, and a gating means for receiving the trigger signal and the predetermined potential and outputting the first signal to control an operation of the first shift registers, the second means includes a second logical gate having an input terminal for receiving the one of the first output signals output from the first shift registers and an output terminal, a flip-flop circuit for receiving the initial signal and a potential of the output terminal of the second logical gate and holding the predetermined potential, and a gating means for receiving the trigger signal and the predetermined potential and outputting the second signal to prevent the trigger signal from being input into the second shift registers until the one of the first output signals is input into the input terminal of the second logical gate, and the third means includes a third logical gate having one input terminal for receiving the one of the first output signals output from the first shift registers and the other input terminal for receiving one of the second output signals output from the second shift registers and an output terminal, a flip-flop circuit for receiving the initial signal and a potential of the output terminal of the third logical gate and holding the predetermined potential, and a gating means for receiving the trigger signal and the predetermined potential and outputting the third signal to prevent the trigger signal from being input into the third shift registers until both the one of the first output signals and the one of the second output signals are input into the input terminal of the third logical gate.

23. The selection circuit of claim 11, wherein the first means includes a first logical gate having an input terminal for receiving a predetermined potential and an output terminal, a flip-flop circuit for receiving the initial signal and a potential of the output terminal of the first logical gate and holding the predetermined potential, and a gating means for receiving the trigger signal and the predetermined potential and outputting the first signal to control an operation of the first shift registers, the second means includes a second logical gate having an input terminal for receiving the one of the first output signals output from the first shift registers and an output terminal, a flip-flop circuit for receiving the initial signal and a potential of the output terminal of the second logical gate and holding the predetermined potential, and a gating means for receiving the trigger signal and the predetermined potential and outputting the second signal to prevent the trigger signal from being input into the second shift registers until the one of the first output signals is input into the input terminal of the second logical gate, the third means includes a third logical gate having one input terminal for receiving the one of the first output signals output from the first shift registers and the other input terminal for receiving one of the second output signals output from the second shift registers and an output terminal, a flip-flop circuit for receiving the initial signal and a potential of the output terminal of the third logical gate and holding the predetermined potential, and a gating means for receiving the trigger signal and the predetermined potential and outputting the third signal to prevent the trigger signal from being input into the third shift registers until both the one of the first output signals and the one of the second output signals are input into the input terminal of the third logical gate, and the fourth means includes a fourth logical gate having a first input terminal for receiving the one of the first output signals output from the first shift registers, a second input terminal for receiving one of the second output signals output from the second shift registers, and a third input terminal for receiving one of the third output signals output from the third shift registers and an output terminal, a flip-flop circuit for receiving the initial signal and a potential of the output terminal of the fourth logical gate and holding the predetermined potential, and a gating means for receiving the trigger signal and the predetermined potential and outputting the fourth signal to prevent the trigger signal from being input into the fourth shift registers until the one of the first output signals, the one of the second output signals, and the one of the third output signals are input into the input terminals of the fourth logical gate.

24. The selection circuit of claim 6, wherein each of the decoding means includes a logical gate for receiving one of the first output signals and one of the second output signals and for outputting a first logical signal, and an output driver circuit for receiving the first logical signal and outputting a second logical signal to select one of the selection lines.

25. The selection circuit of claim 7, wherein each of the decoding means includes a logical gate for receiving one of the first output signals and one of the second output signals and outputting a first logical signal, and an output driver circuit for receiving the first logical signal and outputting a second logical signal to select one of the selection lines.

26. The selection circuit of claim 8, wherein each of the decoding means includes a logical gate for receiving one of the first output signals and one of the second output signals and outputting a first logical signal, and an output driver circuit for receiving the first logical signal and outputting a second logical signal to select one of the selection lines.

27. The selection circuit of claim 9, wherein each of the decoding means includes a logical gate for receiving one of the first output signals and one of the second output signals and for outputting a first logical signal, and an output driver circuit for receiving the first logical signal and outputting a second logical signal to select one of the selection lines.

28. The selection circuit of claim 10, wherein each of the decoding means includes a logical gate for receiving one of the first output signals and one of the second output signals and outputting a first logical signal, and an output driver circuit for receiving the first logical signal and outputting a second logical signal to select one of the selection lines.

29. The selection circuit of claim 11, wherein each of the decoding means includes a logical gate for receiving one of the first output signals and one of the second output signals and outputting a first logical signal, and an output driver circuit for receiving the first logical signal and outputting a second logical signal to select one of the selection lines.

30. The selection circuit of claim 12, wherein each of the decoding means includes a logical gate for receiving one of the first output signals and one of the second output signals and for outputting a first logical signal, and an output driver circuit for receiving the first logical signal and outputting a second logical signal to select one of the selection lines.

31. The selection circuit of claim 13, wherein each of the decoding means includes a logical gate for receiving one of the first output signals and one of the second output signals and outputting a first logical signal, and an output driver circuit for receiving the first logical signal and outputting a second logical signal to select one of the selection lines.

32. The selection circuit of claim 14, wherein each of the decoding means includes a logical gate for receiving one of the first output signals and one of the second output signals and outputting a first logical signal, and an output driver circuit for receiving the first logical signal and outputting a second logical signal to select one of the selection lines.

33. The selection circuit of claim 6, wherein each of the selection lines is connected to a plurality of memory cells of DRAM.

34. The selection circuit of claim 7, wherein each of the selection lines is connected to a plurality of memory cells of DRAM.

35. The selection circuit of claim 8, wherein each of the selection lines is connected to a plurality of memory cells of DRAM.

36. The selection circuit of claim 9, wherein each of the selection lines is connected to a plurality of memory cells of DRAM.

37. The selection circuit of claim 10, wherein each of the selection lines is connected to a plurality of memory cells of DRAM.

38. The selection circuit of claim 11, wherein each of the selection lines is connected to a plurality of memory cells of DRAM.

39. The selection circuit of claim 12, wherein each of the selection lines is connected to a plurality of memory cells of DRAM.

40. The selection circuit of claim 13, wherein each of the selection lines is connected to a plurality of memory cells of DRAM.

41. The selection circuit of claim 14, wherein each of the selection lines is connected to a plurality of memory cells of DRAM.

* * * * *